United States Patent [19]
van der Mast et al.
[11] Patent Number: 4,766,340
[45] Date of Patent: Aug. 23, 1988

[54] SEMICONDUCTOR DEVICE HAVING A COLD CATHODE

[76] Inventors: Karel D. van der Mast, Hofzicht 20, Pijnacker; Arthur M. E. Hoeberechts; Gerardus G. P. van Gorkom, both of Groenewoudseweg 1, Eindhoven, all of Netherlands

[21] Appl. No.: 21,564

[22] Filed: Mar. 2, 1987

Related U.S. Application Data

[63] Continuation of Ser. No. 695,656, Jan. 28, 1985, abandoned.

[30] Foreign Application Priority Data

Feb. 1, 1984 [NL] Netherlands ........................ 8400297

[51] Int. Cl.⁴ ............................................ H01L 31/00

[52] U.S. Cl. .................................... 313/366; 313/309; 357/55

[58] Field of Search .............. 313/365, 366, 309, 310, 313/387; 357/55

[56] References Cited

U.S. PATENT DOCUMENTS 3,475,661 10/1969 Iwata et al. .......................... 357/55
3,597,665 8/1971 Quetsch, Jr. .......................... 357/55
3,737,701 6/1973 Hoeberechts et al. ............. 313/366
3,921,022 11/1975 Levine ................................ 313/309
3,970,887 7/1976 Smith et al. ......................... 313/366
3,998,678 12/1976 Fukase et al. ....................... 313/309
4,008,412 2/1977 Yuito et al. ......................... 313/309
4,303,930 12/1981 von Gorkom et al. .............. 357/13
4,307,507 12/1981 Gray et al. .......................... 313/309
4,370,797 2/1983 Van Gorkom et al. ............ 313/366
4,410,832 10/1983 Smith et al. ......................... 313/366
4,513,308 4/1985 Greene et al. ....................... 313/366
4,578,614 3/1986 Gray et al. .......................... 313/309

FOREIGN PATENT DOCUMENTS 1444544 8/1976 United Kingdom ................ 313/366
2109156 5/1983 United Kingdom ................ 313/309

*Primary Examiner*—Jerry W. Myracle
*Assistant Examiner*—Hezron E. Williams
*Attorney, Agent, or Firm*—Thomas A. Briody

[57] ABSTRACT

In a semiconductor cathode, the electron-emitting part of a pn junction is provided in the tip of a projecting portion of the semiconductor surface which is situated within an opening in an insulating layer on which an acceleration electrode is disposed. Due to the increased electric field near the tip, a reduction of the work function (Schottky effect) is obtained. As a result, cathodes can be realized in which a material reducing the work function, such as caesium, may be either dispensed with or replaced, if required, by another material, which causes lower work function, but is less volatile. The field strength remains so low that no field emission occurs and serarate cathodes can be driven individually, which is favorable for applications in electron microscopy and electron lithography.

10 Claims, 4 Drawing Sheets

SEMICONDUCTOR DEVICE HAVING A COLD CATHODE

This is a continuation of application Ser. No. 695,656, filed Jan. 28, 1985, now abandoned.

BACKGROUND OF THE INVENTION

The invention relates to a semiconductor device for producing an electron beam, having at least one cathode comprising a semiconductor body which is provided at a major surface with an electrically insulating layer with at least one opening, in which at least one acceleration electrode is provided on the insulating layer at the edge of the opening and the semiconductor body has a pn junction within the opening.

The invention further relates to a camera tube and a display arrangement provided with such a semiconductor device.

Semiconductor devices of the kind mentioned in the opening paragraph are known from the Netherlands Patent Application Nr. 7905470 corresponding to U.S. Pat. Nos. 4,303,930 and 4,370,797.

They are used inter alia in cathode-ray tubes, in which they replace the conventional thermionic cathode, in which electron emission is produced by heating. In addition, they are used, for example, in apparatus for electron microscopy. In addition to the high energy consumption for heating, thermionic cathodes have the disadvantage that they are not immediately ready for use because they must be first heated up sufficiently before emission occurs. Moreover, in the long run the cathode material is lost due to evaporation so that these cathodes have a limited lifetime.

In order to avoid the heating source, which is troublesome in practice, and in order to also meet the other disadvantages, the use of a cold cathode has been aimed at.

The cold cathodes known from the aforementioned Netherlands Patent Application are based on the emission of electrons from the semiconductor body when a pn junction is operated in the reverse direction in such a manner that avalanche multiplication occurs. Certain electrons can then obtain such a quantity of kinetic energy as is necessary to exceed the electron work function: these electrons are then released at the surface and thus supply an electron current.

In this type of cathode, a maximum efficiency is aimed at, which can be attained by a minimum work function for the electrons. This is achieved, for example, in that a layer of material reducing the work function is applied to the surface of the cathode. Preferably, caesium is used for this purpose because this material causes a maximum reduction of the electron work function. The use of caesium also has a number of disadvantages, however. For example, caesium is very sensitive to the presence (in the environment of use of the cathode) of oxidizing gases (water vapor, oxygen). Moreover, caesium is rather volatile, which may be disadvantageous in those applications in which substrates or preparations are situated in the proximity of the cathode, as may be the case, for example, in electron lithography or electron microscopy. The evaporated caesium can then be deposited on the said objects.

SUMMARY OF THE INVENTION

The present invention has inter alia for its object to provide a semiconductor device of the kind mentioned above, in which no material reducing the work function need be used so that the aforementioned problems do not arise.

An additional object is to provide cold cathodes of the said kind which, if the use of caesium or another material reducing the electron work function involves no or negligibly few problems, have a considerably higher efficiency than the cathodes known hitherto.

It is based on the recognition of the fact that this can be achieved in that the semiconductor body is given a particular geometry at the area at which the electron emission occurs.

A semiconductor device according to the invention is characterized in that within the opening the semiconductor body has at least one projecting portion, whose cross-section parallel to the major surface decreases with distance from the major surface.

Such a projecting portion may be, for example, substantially conical or partly rounded off at the apex.

Thus, it is achieved that near the apex of the projecting portions very high electric fields occur in the operating condition. The resulting reduction of work function due to the Schottky effect is considerably larger than with planar semiconductor cathodes due to the form chosen.

On the one hand, the work function is thus reduced sufficiently so that at voltages permissible in connection with insulation (up to about 100 V at the conducting layer) the efficiency of, for example, a silicon cathode is so high that no material reducing the work function, such as, for example, caesium, need be used.

On the other hand, a material other than caesium can now be chosen for the material reducing the work function, which causes a smaller reduction of the work function, it is true, but is less volatile or less sensitive to chemical reactions with residual gases in the vacuum system, such as, for example, gallium or lanthanum.

Finally, in this manner semiconductor cathodes, more particularly silicon cathodes coated with caesium, can be obtained which have a very high efficiency. Such cathodes can be used if the precence of caesium is harmless for preparation or substrates present.

A first preferred embodiment of a semiconductor device according to the invention is characterized in that the pn junction is located between an n-type surface region adjoining the surface of the semiconductor body within the opening and a p-type region, in which, when a voltage is applied in the reverse direction across the pn junction, electrons are produced in the semiconductor body, which emanate from the semiconductor body, the breakdown voltage being reduced in a part of the projecting portion.

The desired reduction of the breakdown voltage may be obtained, for example, in that an additional p-type region is provided at the area of the projecting portion. The advantages of such cold cathodes with a locally reduced breakdown voltage are decribed in the aforementioned Netherlands Patent Application Nr. 7905470.

It should be noted that the potential at the acceleration electrode must not exceed a given maximum for various reasons. In the first place, dependent upon the thickness of the subjacent insulating material (for example silicon dioxide), such a field strength can be obtained that breakdown of this insulating material occurs. Besides, with very high field strengths (about $3.10^9$ V/m), at the end of the projecting portion the emitter can act as a field emitter. The emission properties are then fully determined by the potential at the acceleration electrode so that the voltage across the reverse-biased pn junction no longer influences these properties. Especially with the use of several cathodes, for example in a display arrangement and in electron lithography, it is desirable to be able to switch them separately on and off. For this reason and in order to prevent the semiconductor device from being damaged, in practice the field strenght is preferably limited to, for example, $2.10^9$ V/m.

Cathodes according to the invention can be used, as described, in a camera tube, while various applications also exist for a display arrangement having a semiconductor cathode according to the invention. One of these applications, for example, is a display tube which has a fluorescent screen which is activated by the electron current originating from the semiconductor device.

BRIEF DESCRIPTION OF THE DRAWING

The invention will now be described more fully with reference to several embodiments and the drawing, in which.

Figure 1:
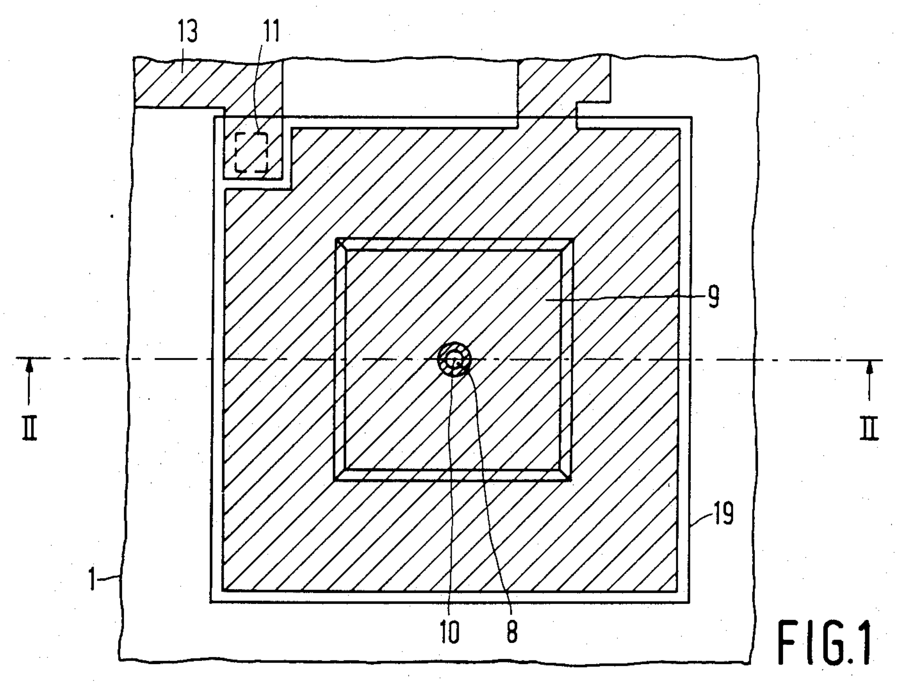
FIG. 1 shows diagrammatically a plan view of a semiconductor device according to the invention.

The Figures are schematic and not drawn to scale, while for the sake of clarity in the cross-sections especially the dimensions in the direction of thickness are greatly exaggerated. Semiconductor zones of the same conductivity type are generally cross-hatched in the same direction; in the Figures, corresponding parts are generally designated by the same reference numerals.

DESCRIPTION OF THE PREFERRED EMBODIMENTS

Figure 2:
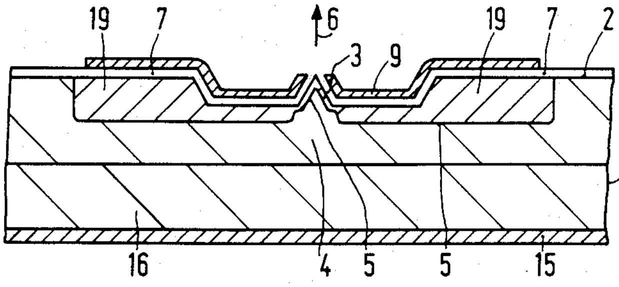
FIGS. 2 and 3 show diagrammatically cross-sections of the semiconductor device taken on the line II—II in FIG. 1.
Figure 3:
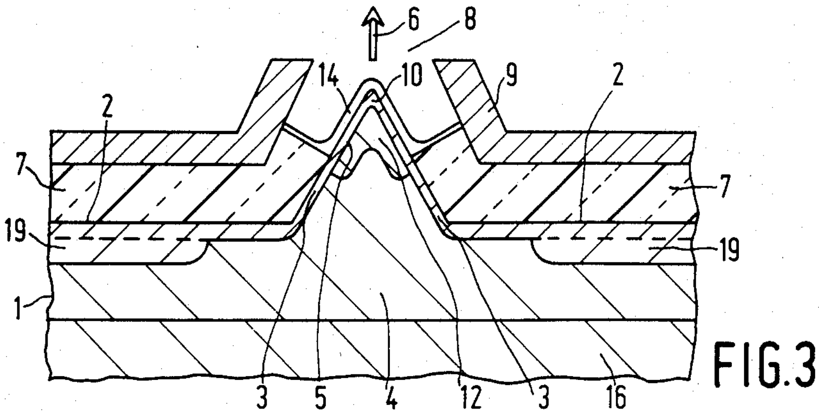
Figure 4:
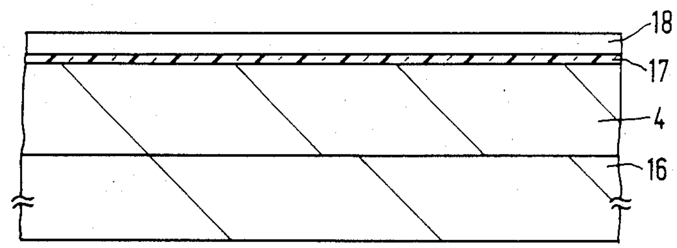
FIGS. 4 to 11 show diagrammatically in cross-section the semiconductor device shown in FIGS. 2 and 3 at successive stages of its manufacture.

FIG. 1 shows in plan view and FIGS. 2 and 3 show in cross-section taken on the line II—II in FIG. 1, a semiconductor device for producing an electron beam. The device comprises for this purpose a semiconductor body 1, in this example of silicon. The semiconductor body has an n type region 3 which adjoins a surface 2 of the semiconductor body and which forms with a p-type region 4 the pn junction 5. By applying a voltage in the reverse direction across the pn junction, electrons are generated by avalanche multiplication, which emanate from the semiconductor body. This is indicated by the arrow 6 in FIG. 2,3.

The surface 2 is provided with an electrically insulating layer 7 of, for example, silicon oxide, in which in this example a circular opnening 8 is provided. Further, an acceleration electrode 9, which is in this example of polycrystalline silicon, is provided on the insulating layer 7 at the edge of the opening 8.

The pn junction 5 has in the projecting portion 10 within the opening 8 a lower breakdown voltage than the remaining part of the pn junction. In this example, the local reduction of the breakdown voltage is obtained inter alia in that the depletion zone at the breakdown voltage is narrower than at other points of the pn junction 5. The part of the pn junction 5 with reduced breakdown voltage is separated from the surface 2 by the n-type layer 3. This layer has such a thickness and doping that at the breakdown voltage the depletion zone of the pn junction 5 does not extend as far as the surface 2. As a result, a surface layer remains present, which ensures the conduction of the non-emitted part of the avalanche current. The surface layer is sufficiently thin to allow a part of the electrons generated by avalanche multiplication to pass, which electrons emanate from the semiconductor body 1 and form the beam 6.

The part of reduced width of the depletion zone and hence the local reduction of the breakdown voltage of the pn junction 5 is obtained in the present example by providing a more highly doped p -type region 12 within the opening 8, which region forms a pn junction with the n-type region 3.

The semiconductor device is further provided with a connection electrode 13, which is connected through a contact hole 11 to the n-type contact zone 19, which is connected to the n-type zone 3. The p-type zone is contacted in this example on the lower side by means of the metallization layer 15. This contacting preferably takes place via a highly doped p -type contact zone 16.

In the example of FIGS. 1 and 2, the donor concentration in the n-type region 3 at the surface is, for example, $10^{19}$ atoms/cm$^3$, while the acceptor concentration in the p-type region 4 is considerably lower, for example $10^{15}$ atom/cm$^3$. The more highly doped p-type region 12 within the opening 8 has an acceptor concentration at the area of the pn junction of, for example, $10^{18}$ atoms/cm$^3$. Thus, at the area of this region 12 the depletion zone of the pn junction 5 has a reduced width, which results in a reduced breakdown voltage. As a result, the avalanche multiplication will occur first at this area.

According to the invention, the semiconductor body has within the opening 8 the projecting portion 10, which in the present example is substantially conical. Upon application of a voltage in the reverse direction across the pn junction 5 in the device shown in FIGS. 1,2 and 3, there is formed on both sides of this junction a depletion zone, that is to say a region in which substantially no mobile charge carriers are present. Outside this depletion zone, conduction is quite well possible so that substantially the whole voltage is applied across this depletion zone. The electric field associated therewith can now become so high that avalanche multiplication occurs. Electrons are then released, which are accelerated by the present field in such a manner that upon collision with silicon atoms they form electron-hole pairs. The electrons formed thereby are in turn accelerated again by the electric field and can form again electron-hole pairs. The energy of the electrons can be so high that the electrons have sufficient energy to emanate from the material. As a result, an electron beam is obtained, which is indicated in FIGS. 2,3 diagrammatically by the arrow 6.

By means of the acceleration electrode 9, which is located on an insulating layer 7 at the edge of an opening 8, the released electrons can be accelerated in a direction substantially at right angles to the major surface 2 by giving the acceleration electrode 9 a positive potential. In general, this is an additional acceleration in this direction because such a semiconductor structure (cathode) in practice forms part of a device in which, as the case may be at a certain distance, a positive anode or another electrode, such as, for example, a control grid, is already present.

Due to the fact that according to the invention the semiconductor surface has within the opening 8 a very particular shape, especially if, as in this example, the conical part has a pointed tip, a very strong electric field can be produced near this tip by means of voltages at the electrode 9, which do not adversely affect the further operation of the cathode.

The strong electric field in fact gives rise to a potential reduction $\Delta\phi$ (the so-called Schottky effect), for which it holds that:

$$\Delta\phi \sqrt{\frac{eE}{4nEo}}$$

herein, e=elementary charge of 1.6. $10^{-19}$ Coulomb

Eo=the dielectric constant of the vacuum $8.85.10^{-12}Fm^{-1}$

E=the electric field in V/m.

With an electric field 1.6. $10^9$ V/m, the Schottky effect with silicon gives rise to a reduction of the work function of about 1.5 V (from 4.5. V to 3 V). This results in such an improvement in efficiency that such a cathode may be used, if required, without a layer 14 of material reducing the work function. Further, instead of the volatile caesium, other materials, such as barium, gallium or lanthanum, may now be used for the layer 14 reducing the work function, which yield a smaller reduction of the work function, it is true, but are less sensitive to the environmental conditions than caesium.

The said field strength is at the same time sufficiently low to avoid the occurence of so-called field emission. With a field strength of about $3.10^9$ V/m, the electric field is so strong that the electron emission is determined substantially entirely by the external electric field and the contribution of the avalanche multiplication is practically negligible. It is then no longer possible either to control the emission by switching the pn junction on and off.

In certain cases, for example in a vacuum tube in which the cathode is mounted, a layer 14 of caesium reducing the work function can be used because this layer does not exert an unfavorable influence there.

The work function of a silicon cathode according to the invention is then reduced to, for example, a few tenths of a volt, which results in a very high efficiency for such a cathode.

The tip of the projecting portion 10 which in the present embodiment is substantially conical, may also be rounded off. In this case, the associated radius of curvature preferably has a value between 0.01 and 1 μm. This has the advantage that such cathodes can be manufactured in a more reproducible manner.

The device shown in FIGS. 1, 2 and 3 can be manufactured as follows (see FIGS. 4 to 11 ).

The starting material is a (100) oriented highly doped p-type substrate 16 on which a p-type 8 μm thick epitaxial layer 4 is grown epitaxially having an acceptor concentration of $10^{15}$ atoms/cm$^3$. The assembly is then coated with a double layer consisting of a 30 nm thick layer of oxide 17 and an about 70 nm thick layer of nitride 18 (see FIG. 4).

Figure 5:
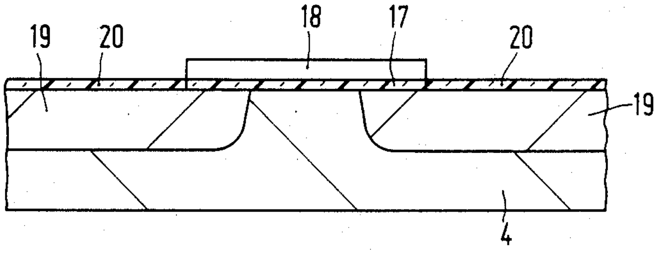
Figure 6:
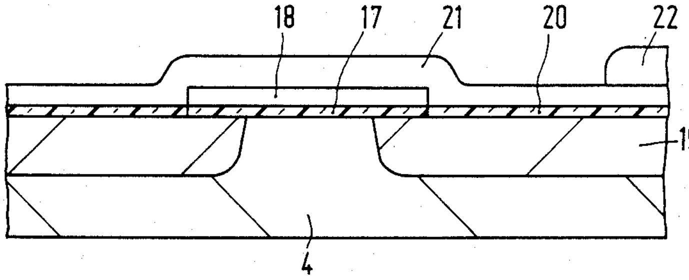
Figure 7:
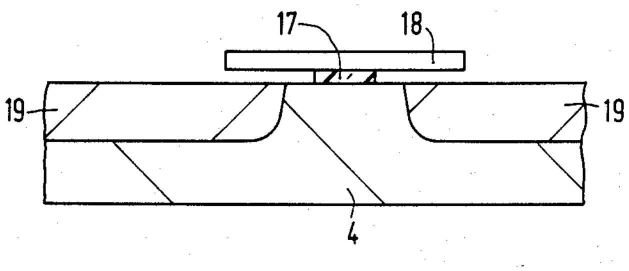
Figure 8:
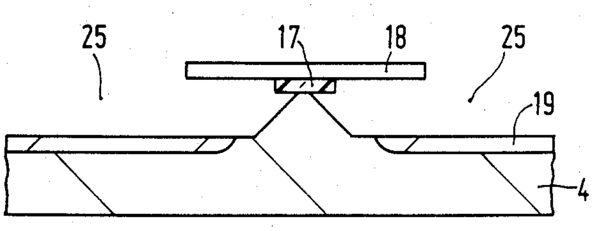

With the aid of a first photolacquer mask, the nitride 18 is patterned by etching, just like the subjacent oxide 17. With the use of the remaining parts of the double layer 17,18 as a mask, phosphorus doping is carried out (for example by diffusion). As a result, highly doped n-type regions 19 are obtained which also serve to reduce the series resistance of the ultimate cathode. After the n-type regions 19 have been formed, they are provided at their surface by means of thermal oxidation with an oxide layer 20 (FIG. 5).

The assembly is then coated with a nitride layer 21 applied from the vapor phase (CVD techniques) and having a thickness of about 70 nm. A second photolacquer mask 22, which, if desired, may be provided on the nitride layer 21, protects, where necessary, the underlying surface from the following operations in order that at a later stage connection contacts or circuit elements can be realized here.

Subsequently, the nitride 18,21 is etched over a thickness of about 80 nm by means of reactive ion etching or by means of plasma etching. The nitride 20 is then removed completely, while the nitride 18 is partly maintained. With the use of this nitride 18 as a mask, the subjacent oxide 20 is now removed by means of wet etching. Due to under-etching, also a part of the oxide 17 under the nitride 18 is then removed. (see FIG. 7).

In the exposed silicon, depressions 25 are etched by means of preferential etching, for example in a bath on the basis of potassium hydroxide, down to a depth of about 3 μm. Due to the preferential etching and a suitable choide of the dimensions of the oxide-nitride double mask 17,18, this treatment results in that projecting portions 10 are formed in the depressions 25 at the area of this double mask (see FIG. 8).

Figure 9:
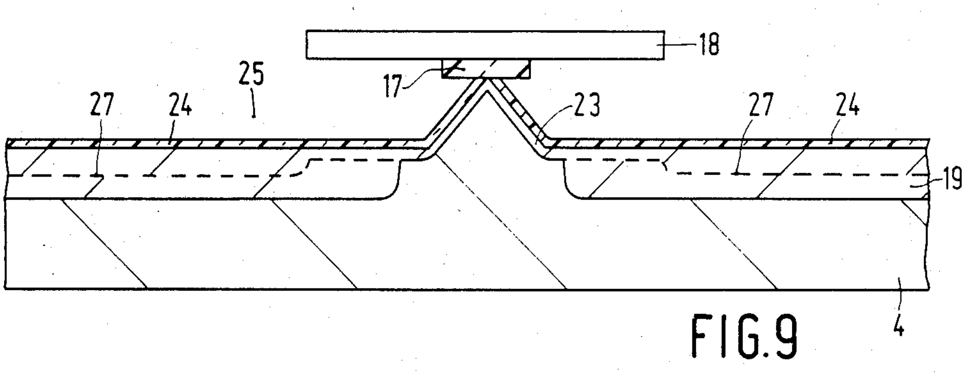
Figure 10:
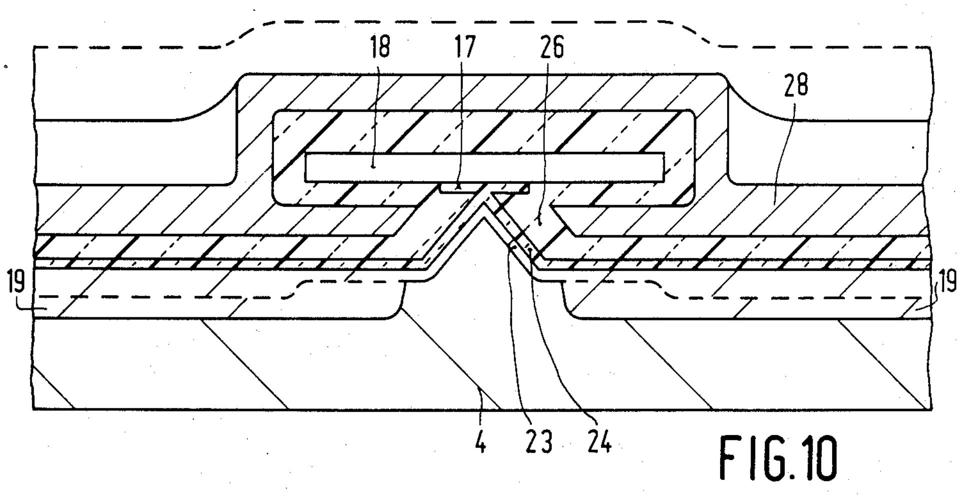

Inter alia for the ultimate n-type region 3, an arsenic implantation is then carried out with such an energy that the arsenic ions penetrate through the nitride 18 and the oxide 17. As a result, the n-type region 23 is formed outside the regions 19, as indicated in FIG. 9, while the series resistance is further reduced inside the regions 19 due to this implantation (broken line 29).

Subsequently, by means of deposition techniques at reduced pressure (LPCVD techniques), an oxide layer 26 having a thickness of about 1 μm and an about 1 μm thick layer 28 of polycrystalline silicon are successively applied. In the present case, these thicknesses are chosen so that the depressions 25 are completely filled by the oxide 26 and the polycrystalline silicon 28 (see FIG. 10). In order to render the polycrystalline silicon conducting, it is doped, for example, with boron.

Subsequently, diluted positive photolacquer is applied on the whole device, which lacquer has such a viscosity that it spreads substantially uniformly over the device. This photolacquer is then developed without exposure and is then gradually dissolved. This process is continued until the polycrystalline silicon 28 is exposed. Due to the choice of the kind of lacquer and the thickness of the lacquer layer (the residual lacquer layer 29 is thicker than the removed layer 30), it can be achieved that first the polycrystalline silicon 28 above the nitride 18 is exposed. As soon as this polycrystalline silicon 28 is exposed, it is etched, for example over a thickness of 1 μm. Since the residual photolacquer layer protects from this etching treatment, the polycrystalline silicon 28 is removed and the oxide 26 is exposed only on the upper side. This exposed oxide 26 is then etched over such a distance that the projecting portions 10 are exposed for the major part or entirely. Due to the fact that then the residual parts of the nitride 18 are strongly underetched, they are detached from the semiconductor device and can then be removed by ultrasonic vibration. The residual oxide 26 constitutes the insulating layer 7, as shown in FIGS. 2 and 3.

Figure 11:
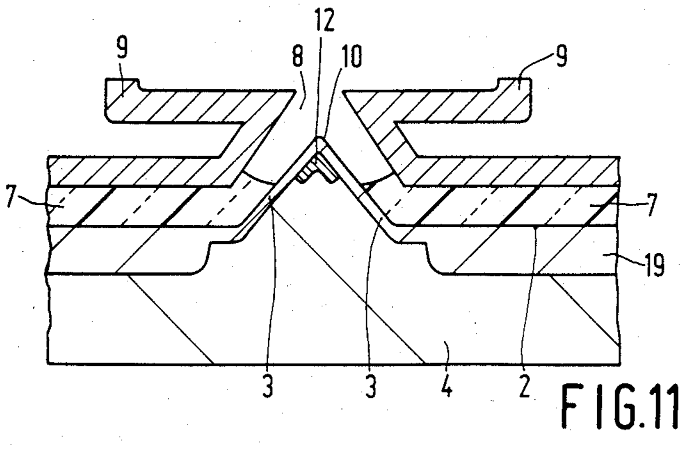

With the use of the polycrystalline electrode 9 as a mask, the p-type region 12 is then provided in the tip of the projecting portion 10 by means of a boron implantation. Subsequently, the surface of the projecting portion 10 is n-doped through the same mask by means of an arsenic implantation, and the surface zone 3 is then accomplished (FIG. 11).

Essentially, the semiconductor device according to the invention is now accomplished. If the etching treatment of the polycrystalline silicon 28 is continued for a longer time, this polycrystalline silicon obtains the profile shown in FIG. 3.

Finally, the semiconductor device is further provided with connection conductors 13 and 15. For this purpose, the insulating layer 7, which comprises outside the area of the depression 25 the oxide layer 20 and the nitride layer 21, is provided with a contact hole 11 (see FIG. 1), through which the connection conductor 13 contacts the n-type region 19. On the lower side, the semiconductor device is provided with a metallization 15.

As already described above, the electron-emitting surface may be further coated, if desired, with a layer 14 of material reducing the work function, for example barium or lanthanum, which are less volatile than caesium.

Thus, the device shown in FIGS. 1 to 3 is obtained. Besides the use of single cathodes, also a plurality of cathodes according to the invention may be integrated in an XY matrix, in which, for example, the n-type regions are driven by the X-lines and the insulated p-type regions are driven by the Y-lines. By means of an electronic control system, for example shift registers, whose contents determine which of the X-lines and the Y-lines, respectively, are driven, a given pattern of cathodes can now be caused to emit, while, for example, via other registers in conjunction with digital-to-analog converters the potential of the acceleration electrodes can be adjusted. Thus, planar display arrangements can be realized, in which a fluorescent screen is located in an evacuated space at a distance of a few millimeters from the semiconductor device, which screen is activated by the electron current originating from the semiconductor device.

Figure 14:
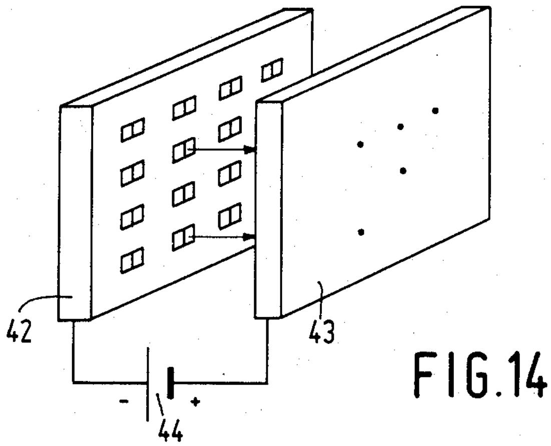
FIG. 14 shows diagrammatically in perspective view a part of a display arrangement, in which a semi-conductor device according to the invention is used.

FIG. 14 shows diagrammatically in perspective view such a planar display arrangement, which comprises beside the semiconductor device 42 a fluorescent screen 43, which is activated by the electron current originating from the semiconductor device. The distance between the semiconductor device and the fluorescent screen is, for example, 5 mm, while the space in which they are situated is evacuated. Between the semiconductor device 42 and the screen 43 there is applied a voltage of the order of 5° to 1° kV via the voltage source 44, which results in that such a high field strength is obtained between the screen and the device that the image of a cathode is of the same order of magnitude as this cathode.

Figure 15:
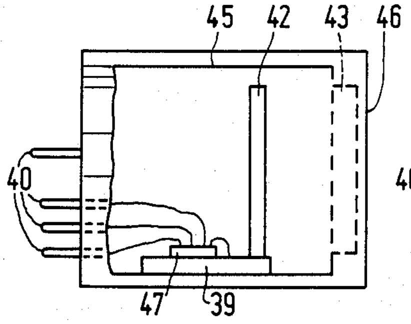
FIG. 15 shows diagrammatically such a display arrangement for display applications.

FIG. 15 shows diagrammatically such a display arrangement, in which the semiconductor device 42 is arranged in an evacuated space 45 at a distance of about 5 mm from the fluorescent screen 43, which forms part of the terminal wall 46 of this space. The device 42 is mounted on a holder 39, on which, if desired, other integrated circuits 47 for the electronic control system are provided; the space 45 is provided with lead-through members 40 for external connections.

Figure 16:
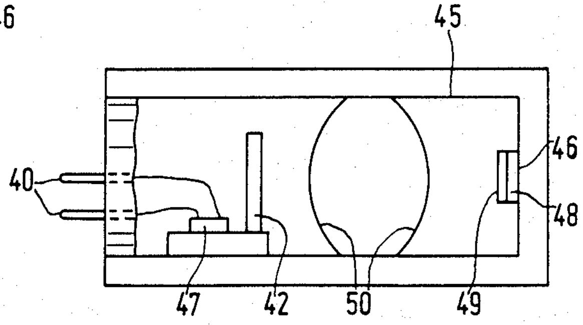
FIG. 16 shows diagrammatically such a display arrangement for use in electron lithography.

FIG. 16 shows diagrammatically a similar vacuum space 45. This space accommodates a system 50 (shown diagrammatically) of electron lenses. A silicon wafer 48 coated with a photoresist layer 49 is provided, for example, in the terminal wall 46. The patterns produced in the device 42 is displayed via the lens system 50, if required on a reduced scale, on the photoresist layer 49.

Consequently, with such an arrangement, patterns can be displayed on a photoresist layer. Thus, great advantages are obtained because now the conventional photomasks may be dispensed with and the desired patterns may be generated and, if required, corrected via the electronic control system in a simple manner.

It is a matter of course that the invention is not limited to the aforementioned examples. For example, especially when the cathode is incorporated in an integrated circuit, the p-type region 4 will not be connected to a connection conductor via a metallization layer on the lower side of the semiconductor body, but via a diffused p-type zone. Further, the p-type region need not necessarily be a(n) (epitaxial) layer having a uniform doping, but may also be a diffused zone.

Instead of silicon, another semiconductor material may also be chosen provided that similar geometries can be realized therein.

Figure 12:
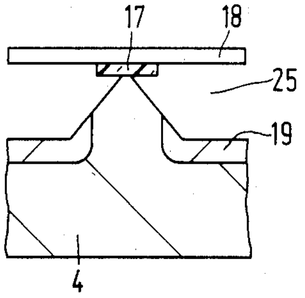
FIG. 12 shows a variation of the semiconductor device shown in FIG. 8.
Figure 13:
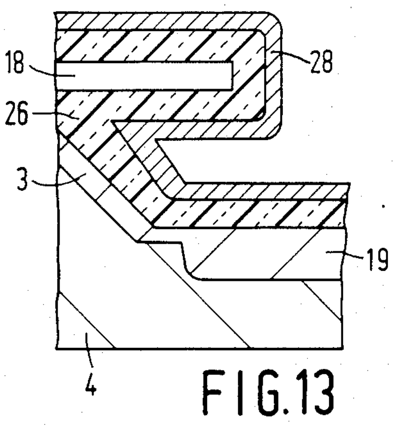
FIG. 13 shows a variation of the semiconductor device shown in FIG. 10.

Further, various modifications are possible in the method of manufacturing. For example, FIG. 12 shows a modification of the intermediate stage shown in FIG. 8, in which due to slightly different dimensions of the depression 25 and a different extent of under-etching, the region 19 extends into the projecting portion 10. FIG. 13 shows a modification of FIG. 10, in which, due to the fact that the layers 26 and 28 have a smaller thickness, the cavity under the nitride 18 is not filled completely, as in FIG. 10. Alternatively, during the reactive etching of the polycrystalline silicon 28, especially in the case of several cathodes in one semiconductor device, this polycrystalline silicon may be screened locally from the etchant.

Besides, such an etchant may be used that the projecting portion 10 becomes facetted (pyramid-shaped). Also the projecting portion 10 may extend over a given length (strip-shaped) and is then rounded off, viewed in cross-section.

What is claimed is:

1. A semiconductor device for producing an electron beam, having at least one cathode comprising a semiconductor body having a major surface, an electrically insulating layer with at least one opening at said major surface, at least one acceleration electrode on the insulating layer at the edge of the opening, and a p-n junction in the semiconductor body within the opening, within the opening the semiconductor body comprising at least one projecting portion, whose cross-section parallel to the major surface decreases as the distance from said major surface increases, and said p-n junction comprising a nonplanar junction whose contour substantially follows the contour of said projecting portion, said device comprising an n-type surface region adjoining the surface of the semiconductor body within said opening and a p-type region therebelow, said n-type and p-type regions forming said p-n junction, so that, when a voltage is applied in the reverse direction across the p-n junction, electrons are generated which emanate from the semiconductor body, said p-n junction locally having a part with a lower breakdown voltage within said opening than over the remaining part of the p-n junction, an n-type surface layer, the junction part with the lower breakdown voltage being separated from the surface by said n-type surface layer, said surface layer having a thickness and doping concentration such that at the breakdown voltage the depletion zone of the p-n junction does not extend as far as the surface, but remains separated therefrom by a distance which is sufficiently thin to allow the generated electrons to pass, the acceleration electrode, viewed in a direction perpendicular to the major surface, leaving free the part of the p-n junction with the lower breakdown voltage, and voltage control means for limiting the electric field strength at the end of the projecting portion to a value of at most $2\times10^9$ V/m.

2. A semiconductor device as claimed in claim 1, characterized in that the projecting portion is substantially of conical shape.

3. A semiconductor device as claimed in claim 1, characterized in that the projecting portion is substantially strip-shaped near the major surface and in that, viewed in a cross-section at right angles to the longitudinal direction of the strip, the projecting portion is rounded off at least near its apex.

4. A semiconductor device as claimed in claim 1, characterized in that the projecting portion is substantially of pyramidal shape.

5. A semiconductor device as claimed in claim 1, 2 or 4, characterized in that the projecting portion is rounded off at least near its apex.

6. A semiconductor device as claimed in claim 5, characterized in that the rounded apex has a radius of curvature between 0.01 and 1 μm.

7. A semiconductor device as claimed in claim 1, 2 or 4, characterized in that within the opening in the insulating layer the surface of the semiconductor body is coated with a material reducing the work function.

8. A camera tube provided with means for controlling an electron beam, which scans a charge image, characterized in that the electron beam is produced by a semiconductor device as claimed in any one of claim 1, 2 or 4.

9. A display arrangement provided with means for controlling an electron beam, which produces an image, characterized in that the electron beam is produced by means of a semiconductor device as claimed in claim 1, 2 or 4.

10. A display arrangement as claimed in claim 9, characterized in that the display arrangement comprises a fluorescent screen which is situated in vacuo at a distance of several millimeters from the semiconductor device and in that the screen is activated by the electron beam originating from the semiconductor device.

* * * * *